United States Patent [19]
Ow et al.

[11] Patent Number: 6,165,268
[45] Date of Patent: Dec. 26, 2000

[54] WAFER CARRIER ADAPTER AND METHOD FOR USE THEREOF

[75] Inventors: Rodney C. Ow, Cupertino; Karl Mathia, Mountain View, both of Calif.

[73] Assignee: PRI Automation, Inc., Billerica, Mass.

[21] Appl. No.: 09/216,011

[22] Filed: Dec. 16, 1998

[51] Int. Cl.[7] .................................................. C23C 16/06
[52] U.S. Cl. .......................... 118/500; 118/728; 118/729; 269/55; 269/56; 414/935; 438/800
[58] Field of Search ..................................... 118/500, 728, 118/729; 269/55, 56; 414/935; 438/800

[56] References Cited

U.S. PATENT DOCUMENTS

5,565,382  10/1996  Tseng ...................................... 118/728

*Primary Examiner*—Richard Bueker
*Attorney, Agent, or Firm*—Weingarten, Schurgin, Gagnebin & Hayes LLP

[57] ABSTRACT

A wafer carrier adapter for use with a 200 millimeter wafer carrier and a pod door opener to a front end of a semiconductor processing environment. The 200 millimeter wafer carrier has a bottom surface and is provided with a plurality of recesses extending through the bottom surface in a predetermined configuration and a front opening for accessing silicon wafers in the wafer carrier. The pod door opener has a platform with a kinematic coupling which includes a plurality of pins extending upwardly in a predetermined pattern from the platform for aligning and supporting 300 millimeter wafer carriers relative to a port in the pod door opener. The wafer carrier adapter comprises a support structure having top and bottom surfaces. The support structure is provided with a plurality of recesses extending through the bottom surface adapted to receive the plurality of pins. The plurality of recesses of the support structure correspond in number to the plurality of pins and are arranged in a pattern corresponding to the predetermined pattern of pins for precisely aligning the support structure relative to the plurality of pins. The top surface has a plurality of protuberances adapted for disposition in the plurality of recesses of the 200 millimeter wafer carrier. The plurality of protuberances are arranged in a configuration relative to the plurality of recesses of the 200 millimeter wafer carrier for precisely aligning the 200 millimeter wafer carrier relative to the plurality of pins so that the front opening of the 200 millimeter wafer carrier faces the port.

13 Claims, 7 Drawing Sheets

WAFER CARRIER ADAPTER AND METHOD FOR USE THEREOF

BRIEF DESCRIPTION OF THE INVENTION

This invention relates to apparatus for use with wafer carriers and more particularly to apparatus for use with silicon wafer carriers used in semiconductor equipment manufacturing.

BACKGROUND OF THE INVENTION

Semiconductor manufacture equipment for processing 300 millimeter silicon wafers is now being utilized in some semiconductor manufacture facilities in place of equipment for processing 200 millimeter silicon wafers. Much of this 300 millimeter equipment is not configured to process 200 millimeter wafers or utilize 200 millimeter wafer carriers. It would be beneficial during the transition from 200 millimeter to 300 millimeter equipment for the equipment operators to be able to use remaining 200 millimeter wafer carriers in 300 millimeter equipment.

SUMMARY OF THE INVENTION

The invention provides a wafer carrier adapter which permits a 200 millimeter wafer carrier to be used in a 300 millimeter semiconductor processing system. The wafer carrier adapter mates with the kinematic coupling of the 300 millimeter system and with the 200 millimeter carrier for precisely aligning the 200 millimeter carrier on the pod door opener. Advantageously, the wafer carrier adapter includes a mechanism for angularly positioning the 200 millimeter carrier relative to the kinematic coupling.

The wafer carrier adapter of the present invention is for use with a 200 millimeter wafer carrier and a pod door opener to a front end of a semiconductor processing environment. The wafer carrier adapter comprises a support structure having top and bottom surfaces. The support structure is provided with a plurality of recesses extending through the bottom surface adapted to receive a plurality of pins included in a kinematic coupling carried by the platform. The plurality of recesses of the support structure correspond in number to the plurality of pins and are arranged in a pattern corresponding to the predetermined pattern of pins for precisely aligning the support structure relative to the plurality of pins. The top surface has a plurality of protuberances adapted for disposition in a plurality of recesses extending through the bottom surface of the 200 millimeter wafer carrier. The plurality of protuberances are arranged in a configuration relative to the plurality of recesses of the 200 millimeter wafer carrier for precisely aligning the 200 millimeter wafer carrier relative to the plurality of pins so that the front opening of the 200 millimeter wafer carrier faces a port in the pod door opener.

DETAILED DESCRIPTION OF THE INVENTION

Reference will now be made in detail to the preferred embodiment of the invention which is illustrated in the accompanying figures. The description of the embodiment of the invention will be followed by a discussion of its operation.

Figure 1:
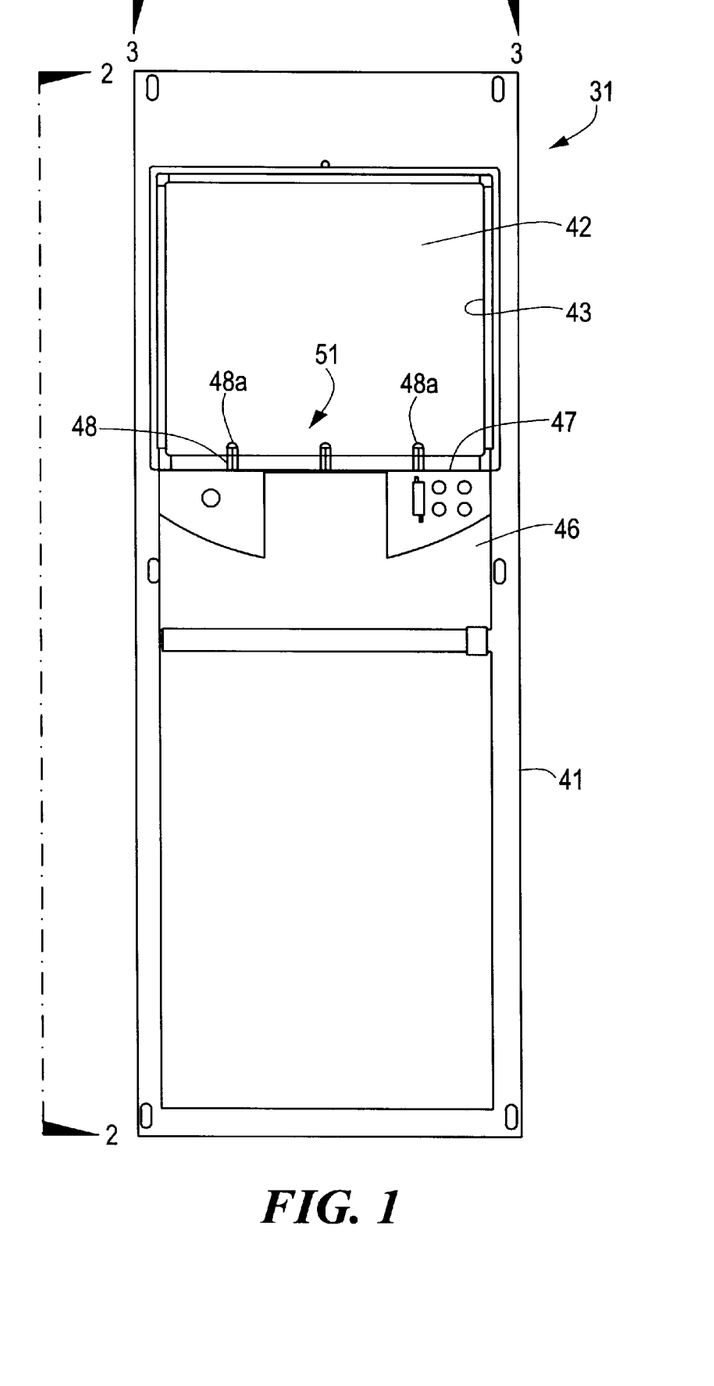
FIG. 1 is a front elevational view of a pod door opener for a 300 millimeter wafer carrier in a semiconductor manufacturing facility.
Figure 2:
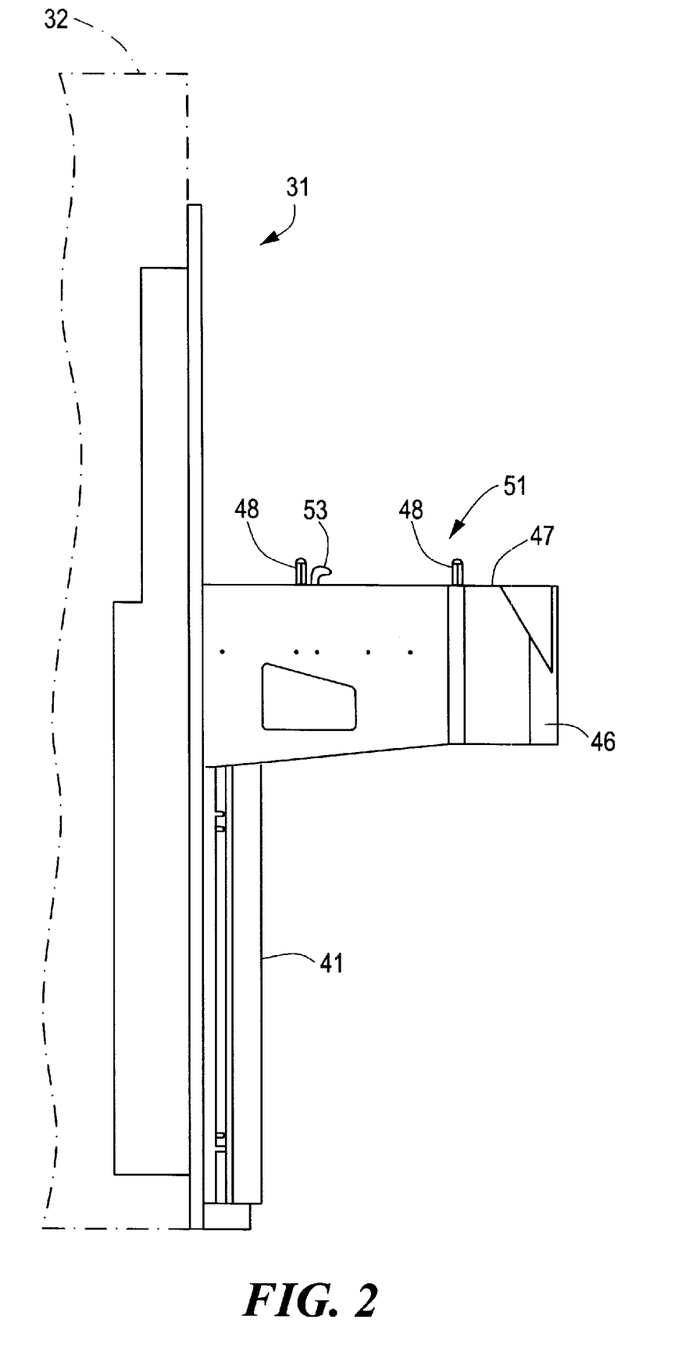
FIG. 2 is a side elevational view of the port door opener of FIG. 1 taken along the line 2—2 of FIG. 1.
Figure 3:
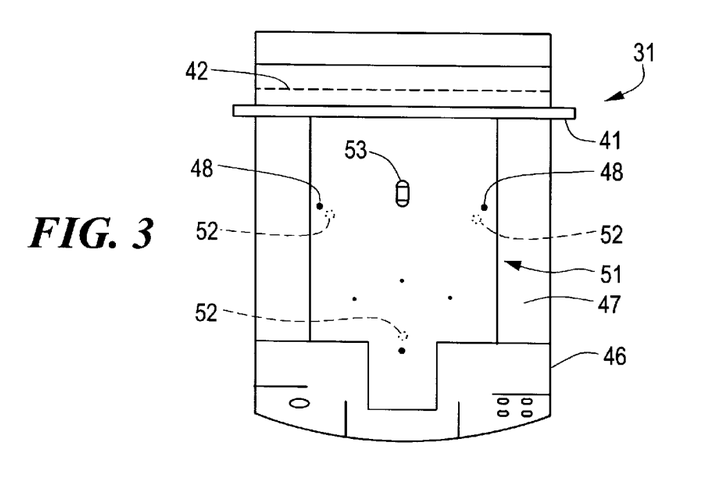
FIG. 3 is a top plan view of the pod door opener of FIG. 1 taken along the line 3—3 of FIG. 1.
Figure 4:
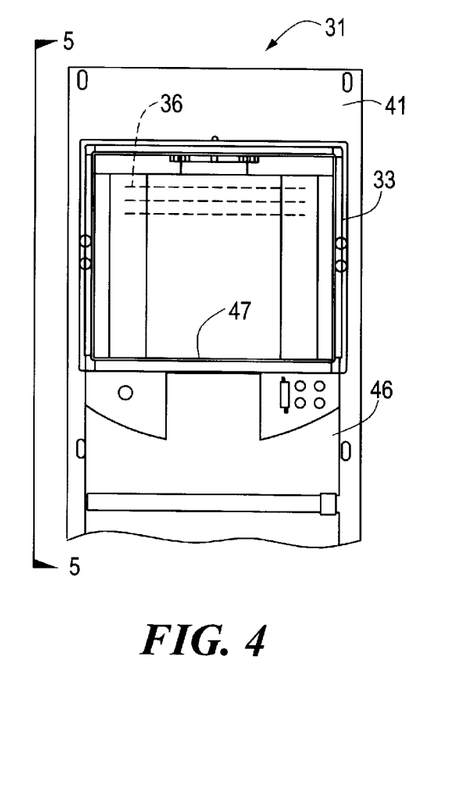
FIG. 4 is a front elevational view, similar to FIG. 1 but partially cut away, of a 300 millimeter wafer carrier positioned on the pod door opener of FIG. 1.
Figure 5:
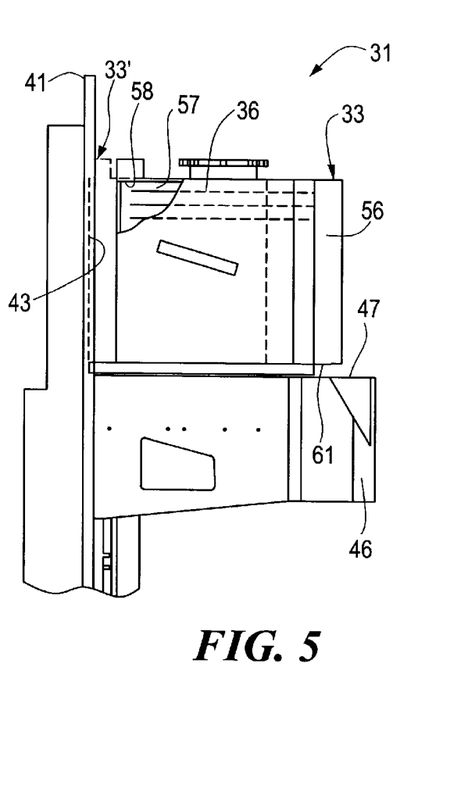
FIG. 5 is a side elevational view, similar to FIG. 2 but partially cut away, taken along the line 5—5 of FIG. 4.
Figure 6:
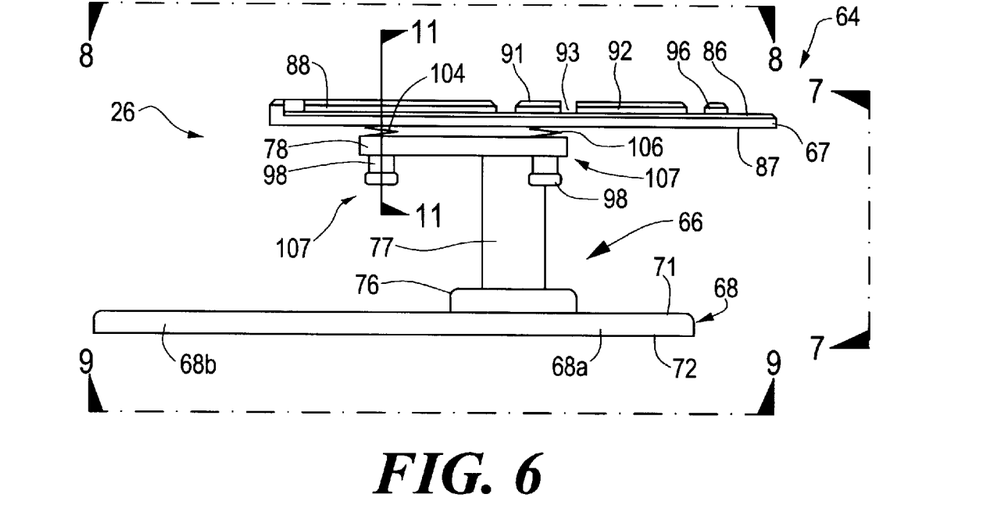
FIG. 6 is a side elevational view of the wafer carrier adapter of the present invention.
Figure 7:
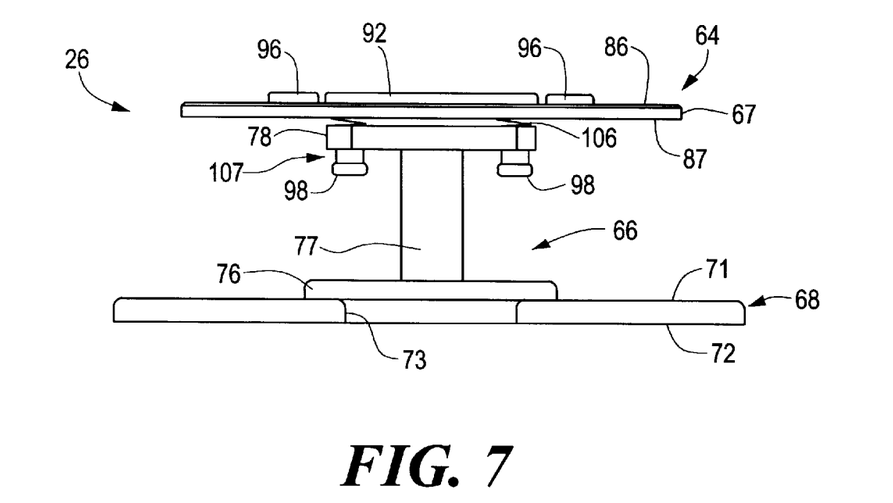
FIG. 7 is a front elevational view of the wafer carrier adapter of FIG. 6 taken along the line 7—7 of FIG. 6.

Wafer carrier adapter 26 of the present invention, shown in FIGS. 6–11, is for use with a conventional pod door opener 31 of the type, for example, manufactured by PRI Automation Inc. of Billerica, Mass. The pod door opener 31, shown in FIGS. 1–3, is an entry point to a semiconductor processing system and specifically to the front end system or mini environment 32 of such a semiconductor processing system. Pod door opener 31 can support a 300 millimeter wafer carrier such as a conventional front opening unified pod (FOUP) 33, as shown in FIGS. 4–5, to permit 300 millimeter silicon wafers 36 in the wafer carrier or FOUP 33 to be accessed by an atmospheric robot in a front end system (not shown) and transported to a cluster tool (not shown) for processing within a vacuum environment of the semiconductor processing system.

Pod door opener 31 has a structural body 41 provided with a door 42 which opens to permit entry through a port 43. A platform 46 extends outwardly from structural body 41 below port 43 and has an upper horizontal surface 47. A plurality of at least three pins 48 extend upwardly from upper surface 47 in a predetermined pattern for registering and aligning a 300 millimeter wafer carrier 33 on the platform 46 relative to port 43. Each of the pins 48 has a generally rounded end 48a having a size and shape as set forth in SEMI Specification No. E57-1296, the entire contents of which are incorporated herein by this reference. The three pins or primary pins 48 serve as a kinematic coupling 51 as defined in SEMI Specification No. E57-1296 and are arranged in the pattern corresponding to the outer pins, as defined in SEMI Specification No. E57-1296, for such a kinematic coupling. In general, the primary pins 48 are arranged in a triangular pattern, with the two pins closest port 43 extending along a line parallel with the plane of door 42 and port 43. Kinematic coupling 51 can further include or can consist of a plurality of three secondary pins 52, shown in phantom lines in FIG. 3, corresponding to the inner pins of a kinematic coupling as defined in SEMI Specification No. E57-1296. A hook-shaped locking mechanism 53 extends upwardly from surface 47 for lockably engaging a 300 millimeter wafer carrier 33.

Conventional 300 millimeter wafer carrier 33 has a body 56 forming a sealed internal cavity 57 for housing wafers 36 during transport. An opening 58 is provided at the front of housing 56 for accessing cavity 57. A door (not shown) is pivotally carried by housing 56 for sealing opening 58 when closed and accessing internal cavity 57 when open. Wafer carrier 33 has a bottom surface 61 provided with a plurality of at least three recesses (not shown) for receiving rounded ends 48a of primary pins 48 so as to register and align the wafer carrier 33 on platform 46. Platform 46 has a mechanism (not shown) for moving a wafer carrier 33 placed thereon from a first position in which opening 58 is spaced apart from port 43 of pod door opener 31, shown in solid lines in FIG. 5, to a second position in which housing 56 is disposed against structural body 41 in a sealable engagement about the port 43, shown in dashed lines in FIG. 5 and identified by reference numeral 33' therein. When desired, door 42 of the pod door opener 31 and the door at opening 58 of the wafer carrier 33 are opened by the pod door opener to permit access to the 300 millimeter wafers 36 within the wafer carrier 33 by the atmospheric robot within front end 32.

Figure 8:
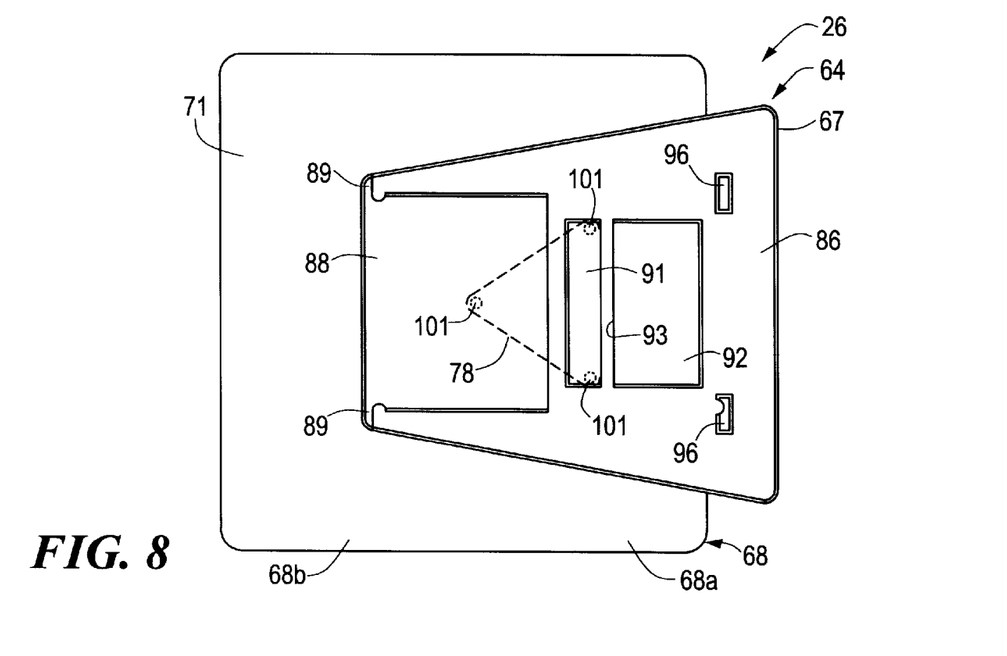
FIG. 8 is a top plan view of the wafer carrier adapter of FIG. 6 taken along the line 8—8 of FIG. 6.
Figure 9:
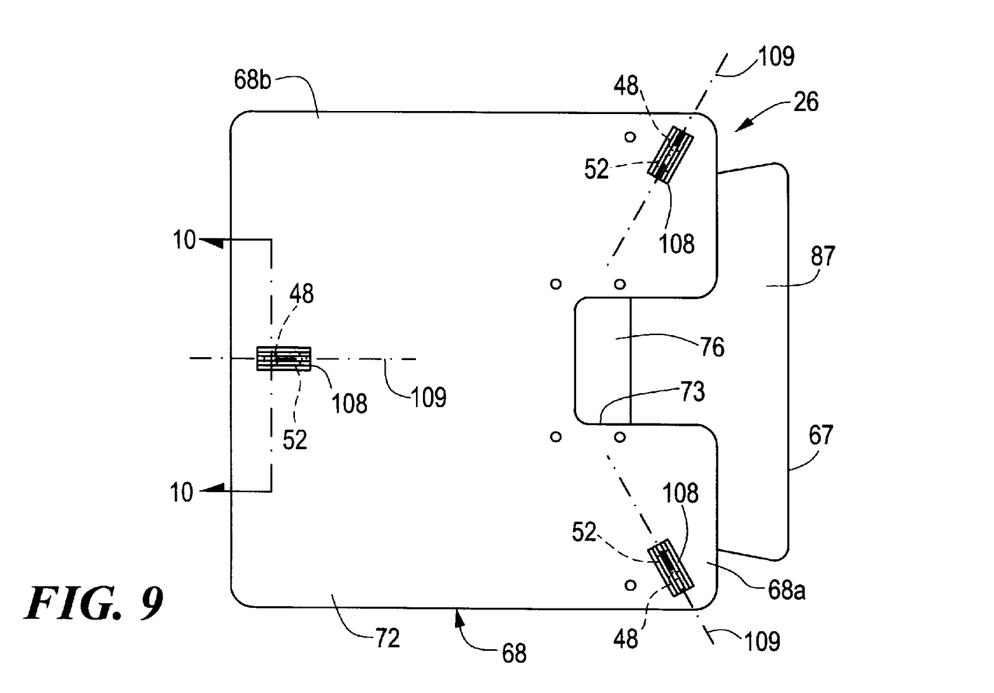
FIG. 9 is a bottom plan view of the wafer carrier of FIG. 6 taken along the line 9—9 of FIG. 6.

Wafer carrier adapter 26 permits conventional 200 millimeter wafer carriers 37 to be placed on kinematic coupling 51 and thus be utilized in the process of front end 32. The wafer carrier adapter 26 has a support member or structure 64, shown in FIGS. 6–8, which is made from stainless steel or any other suitable material and formed from a base member 66 and a platform member 67. The base member 66 has a plate-like base or base plate 68 which is generally square in shape as shown in FIGS. 8 and 9. The base plate 68 has a front end portion 68a and a rear end portion 68b. A first or top planar surface 71 and a second or bottom planar surface 72 extend between the front and rear end portions. Bottom surface 72 is the bottom surface of support structure 64. A square-shaped cutout 73 extends between surfaces 71 and 72 at front end portion 68a of the base plate 68. An intermediate plate 76, which is rectangular in shape and smaller in plan than base plate 68, sits atop the base plate and is bolted to front end portion 68a by any suitable means such as screws. The intermediate plate 76 extends over the rear portion of cutout 73. An upstanding member or post 77 extends upwardly from intermediate plate 76 and is secured thereto by any suitable means such as screws (not shown). A triangular-shaped top plate 78 is mounted to the top end of post 77 by screws or any other suitable means (not shown). Top plate 78 is positioned on post 77 parallel to the base plate 68.

Platform member 67 has a first or top planar surface 86 and a second or bottom planar surface 87. Top surface 86 is the top surface of support structure 64. A plurality of protuberances or raised portions extend upwardly from the top surface 86 and include a square-shaped alignment block 88 formed at the rear of platform member 67. First and second lips 89 protrude from opposite sides of alignment block 88 at the rear end thereof A rectangular-shaped alignment block 91 is disposed forwardly of rear alignment block 88 and a rectangular-shaped front alignment block 92 is disposed forwardly of block 91. Central and front alignment blocks 91 and 92 are spaced apart and form a slot 93 which extends transversely of the platform members 67. First and second corner alignment blocks 96 are disposed forward of alignment block 92. Each corner alignment block 96 is positioned to the side of blocks 91 and 92 and nearby a respective front corner of platform member 67. Blocks 88, 91, 92 and 96 are each provided with a top surface, all of which are planar and aligned in a single plane.

Top plate 78 is included within the means of wafer carrier adapter 26 for attaching platform member 67 to base member 68. Such means further includes at least one set of first and second cooperatively threaded members 97 and 98 (see FIGS. 6, 7 and 11). More specifically, said means includes a plurality of three sets of threaded members 97 and 98. Each of the first threaded members 97 can be in the form of an externally threaded stud extending perpendicularly of bottom surface 87 of the platform member 67 (see FIGS. 6 and 11). A threaded bore 101 is provided in the platform member 67 for threadedly securing each of the threaded studs 97 to the platform member and a vertically-disposed bore 103 is provided in top plate 78 for slidably receiving each of the studs 97 depending from the platform member. Each of the second threaded members 98 can be in the form of a thumb screw nut which threadedly engages the free end of a stud 97 and seats against the bottom planar surface of platform member 67. A spring member or coil spring 104 is concentrically disposed about each of the studs 97 between platform member 67 and top plate 78. The coil spring 104 at least partially seats in an enlarged portion or counterbore 103a of the respective bore 103 which opens onto the top surface of top plate 78. The upper end of coil spring 104 engages the bottom surface 87 of platform member 67 and the lower end of the coil spring sits on an annular surface or shoulder 106 at the bottom of counterbore 103a. Spring 104 is compressed by the tightening of thumb screw nut 98 on threaded stud 97. Each stud 97 and respective nut 98 and coil spring 104 are included within an adjustment mechanism 107 for selectively aligning the angular position of platform member 67 relative to base member 66. The three adjustment mechanisms 107 are aligned in a triangular configuration, with one such adjustment mechanism at each comer of top plate 78 (see FIG. 8).

Figure 10:
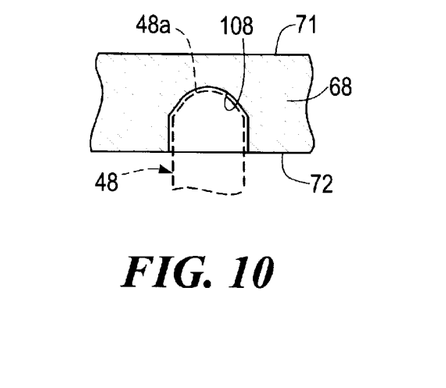
FIG. 10 is a cross-sectional view of the wafer carrier adapter of FIG. 6 taken along the line 10—10 of FIG. 9.
Figure 11:
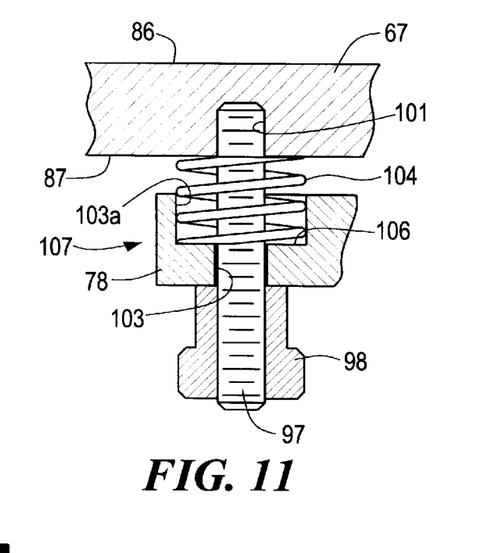
FIG. 11 is a cross-sectional view of the wafer carrier adapter of FIG. 6 taken along the line 11—11 of FIG. 6.
Figure 12:
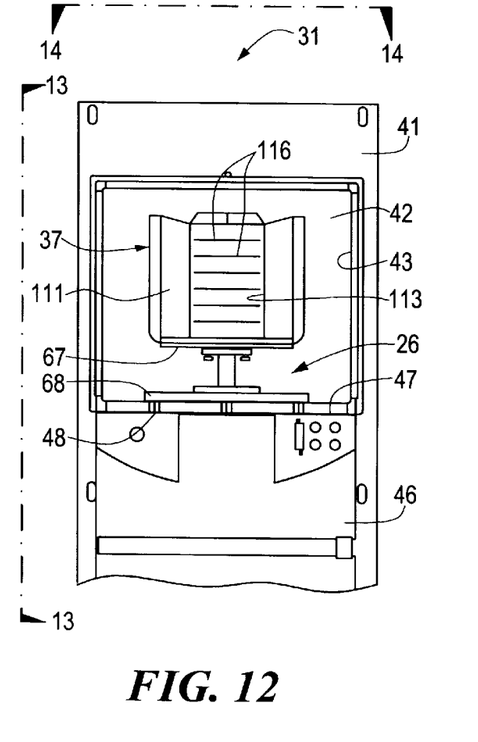
FIG. 12 is a front elevational view similar to FIG. 1 of a 200 millimeter wafer carrier positioned atop the wafer carrier adapter of FIG. 6 on the pod door opener of FIG. 1.
Figure 13:
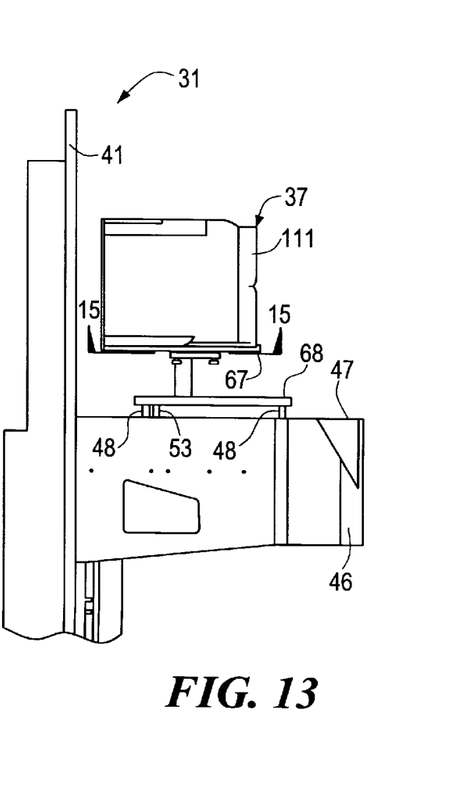
FIG. 13 is a side elevational view, similar to FIG. 2 but partially cut away, taken along the line 13—13 of FIG. 12.
Figure 14:
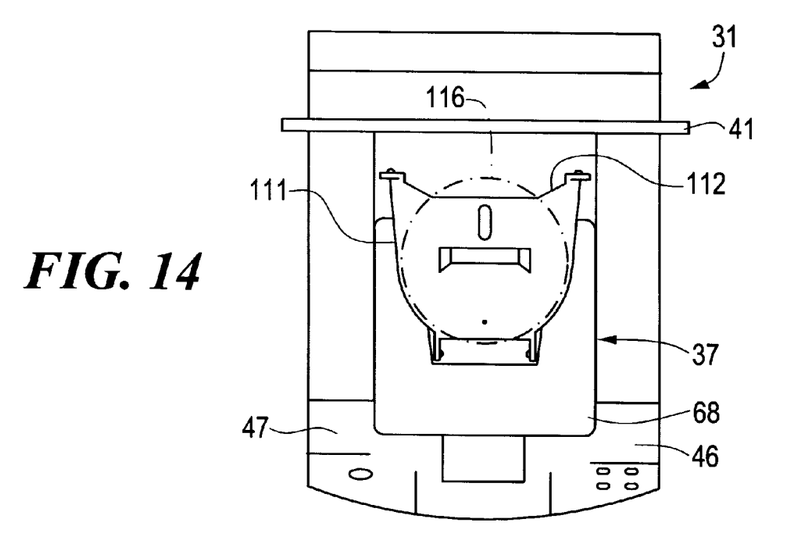
FIG. 14 is a top plan view similar to FIG. 3 taken along the line 14—14 of FIG. 12.
Figure 15:
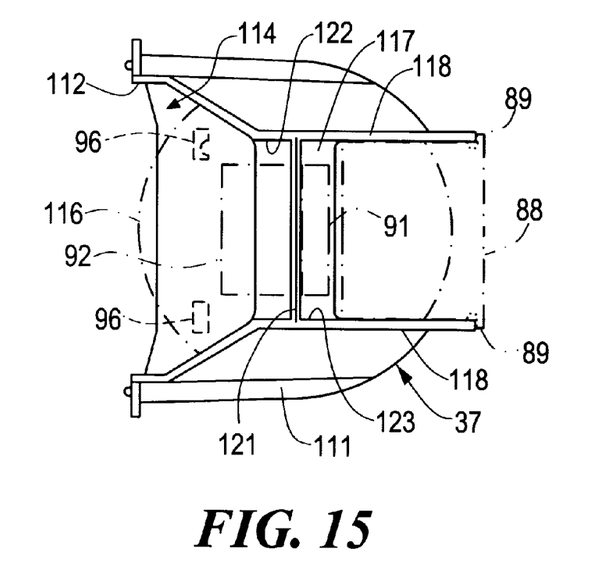
FIG. 15 is a bottom plan view of the 200 millimeter wafer carrier of FIG. 12 with a portion of the wafer carrier adapter shown in phantom lines thereon taken along the line 15—15 of FIG. 13.

Base plate 68 is provided with a plurality of three recesses 108 extending through bottom surface 72 which are adapted to receive the plurality of three primary pins 48 of kinematic coupling 51 (see FIGS. 9 and 10). The recesses 108 are arranged on base plate 68 in a triangular pattern corresponding to the predetermined pattern of kinematic coupling pins 48. One of recesses 108 is provided in rear end portion 68b of base plate 68 and two of the recesses 108 are positioned at opposite corners in front end portion 68a of the base plate on either side of cutout 73. Specifically, each of the recesses 108 is in the form of a slot extending along an axis 109. The three axes 109 meet at the center point of the triangular configuration formed by recesses 108. As shown most clearly in FIG. 10, each of the recesses 108 has a cross-sectional configuration which is generally V-shaped so as to snugly receive the rounded end 48a of a pin 48. Placement of base member 68 on kinematic coupling 51 causes primary pins 48 to seat within respective recesses 108 so as to precisely align the base member 48 and thus wafer carrier adapter 26 on kinematic coupling 51 and platform 46. Each of recesses 108 is longitudinally sized so as to receive the plurality of three inner pins 52 of a kinematic coupling for precisely aligning the wafer carrier adapter 26 on platform 46.

The 200 millimeter wafer carrier 37 is of a conventional type having a housing 111 provided with front and rear openings 112 and 113 to an internal cavity 114 for carrying a plurality of 200 millimeter wafers 116 (see FIGS. 12–15). Bottom surface 117 of the housing 116 is provided with a plurality of recesses for cooperatively receiving at least some of the alignment blocks formed on top of platform member 67. In this regard, the bottom surface 117 has first and second spaced-apart ribs 118 extending longitudinally of the carrier 37 (see FIG. 15). A transversely-extending rib 121 is disposed between ribs 118. Each end of the transverse rib 121 adjoins a longitudinal rib 118 at a right angle. Ribs 118 and 121 form a plurality of recesses which include at least front and rear recesses 122 and 123 arranged in the bottom of wafer carrier 37 in a predetermined configuration.

In one method of processing silicon wafers in the manufacture of integrated circuits, a 300 millimeter wafer carrier 33 is precisely positioned and supported on platform 67 by means of the cooperative engagement of kinematic coupling 51 with the underside of the wafer carrier 33. The front door of wafer carrier 33 and the door 42 of pod door opener 31 are opened so as to access the 300 millimeter wafers 36 within the carrier 33. The wafers 36 are removed from the wafer carrier 33 for processing in a conventional manner.

When it is desired to utilize a 200 millimeter wafer carrier in the silicon wafer processing assembly which includes pod door opener 31, base plate 68 of wafer carrier adapter 26 is positioned on platform 46 in a manner such that primary pins 48 of the pod door opener seat within respective recesses 108 of the wafer carrier adapter. The cooperative engagement of recesses 108 and primary pins 48 results in front end portion 68a of the base plate being positioned on the platform 46 near port 43. Cutout 73 provides clearance for locking mechanism 53 (see FIG. 13). Thereafter, a 200 millimeter wafer carrier such as carrier 37 is positioned atop platform member 67. The alignment blocks 88, 91, 92 and/or 96 provided in top surface 86 of platform member 67 are adapted to cooperatively seat in the recesses 122 and 123 provided in bottom surface 117 of 200 millimeter wafer carrier 37. The alignment blocks are arranged on top surface 86 in a configuration relative to the recesses in the bottom surface 117 for precisely aligning the wafer carrier 37 on wafer carrier adapter 26 and thus platform 46. Specifically, rear alignment block 88 seats between longitudinal ribs 118 in rear recess 123 (see FIG. 15). The rear ends of longitudinal ribs 118 are captured by lips 89. The cooperative engagement of the sides of rear alignment block 88 with longitudinal ribs 118 preclude transverse movement of the wafer carrier 37 relative to the platform member 67. Central and front alignment blocks 91 and 92 seat within front recess 122 in bottom surface 117. Transverse rib 121 extends through the slot 93 formed by the central and front alignment blocks 91 and 92 for further restricting relative longitudinal movement between wafer carrier 37 and platform member 67.

The three point adjustment permitted by the three adjustment mechanisms 107 allows the angular position of platform member 67 relative to base plate 67 to be controlled. Selective adjustment of thumb screw nuts 98 can be used to level platform members 67 and thus properly align the wafer carrier 37 with respect to the pod door opener 31. The cooperative engagement of 200 mm wafer carrier 37 and platform member 67 results in front opening 112 of the wafer carrier 37 facing 43 of pod door opener 31. Upon opening door 42, the 200 millimeter wafers 116 carried by wafer carrier 37 in internal cavity 114 can be accessed through front opening 112 for processing.

If it is later desired to utilize 300 millimeter wafer carriers in the semiconductor manufacturing process, wafer carrier adapter 26 is removed from platform 46 so that a 300 millimeter wafer carrier 33 can be positioned for use on platform 46 in the manner described above.

The wafer carrier adapter 26 permits the front end system 32 of a 300 millimeter system to be used for 200 millimeter wafer processing as well as 300 millimeter wafer processing, thereby increasing the flexibility of the semiconductor manufacture production line.

Although wafer carrier adapter 26 has been described for use with a pod door opener, it should be appreciated that the wafer carrier adapter 26 can be used at any location in a semiconductor manufacturing process or otherwise having a kinematic coupling 51. Without limiting the generality of the foregoing, wafer carrier adapter 26 can be used at any of the interfaces described in SEMI Specification No. E57-1296.

From the foregoing, it can be seen that a wafer carrier adapter has been provided which permits a 200 millimeter wafer carrier to be used in a 300 millimeter semiconductor processing system. The wafer carrier adapter mates with the kinematic coupling of the 300 millimeter system and with the 200 millimeter carrier for precisely aligning the 200 millimeter carrier on the pod door opener. Advantageously, the wafer carrier adapter includes a mechanism for angularly positioning the 200 millimeter carrier relative to the kinematic coupling.

What is claimed is:

1. A wafer carrier adapter for use with a 200 millimeter wafer carrier having a bottom surface and provided with a plurality of recesses extending through the bottom surface in a predetermined configuration and a front opening for accessing silicon wafers in the 200 millimeter wafer carrier and with a pod door opener to a front end of a semiconductor processing environment having a platform with a kinematic coupling which includes a plurality of pins extending upwardly in a predetermined pattern from the platform for aligning and supporting 300 millimeter wafer carriers relative to a port in the pod door opener, comprising a support structure having top and bottom surfaces, the support structure being provided with a plurality of recesses extending through the bottom surface adapted to receive the plurality of pins, the plurality of recesses of the support structure corresponding in number to the plurality of pins and being arranged in a pattern corresponding to the predetermined pattern of pins for precisely aligning the support structure relative to the plurality of pins, the top surface having a plurality of protuberances adapted for disposition in the plurality of recesses of the 200 millimeter wafer carrier, the plurality of protuberances arranged in a configuration relative to the plurality of recesses of the 200 millimeter wafer carrier for precisely aligning the 200 millimeter wafer carrier relative to the plurality of pins so that the front opening of the 200 millimeter wafer carrier faces the port.

2. A wafer carrier adapter as in claim 1 wherein the support structure includes a base member and a platform member and means for attaching the platform member to the base member, the top surface being on the platform member and the bottom surface being on the base member.

3. A wafer carrier adapter as in claim 2 wherein the means for attaching the platform member to the base member support structure includes at least one set of first and second cooperatively-threaded members for adjusting the angular position of the platform member relative to the base member.

4. A wafer carrier adapter as in claim 3 further comprising a coil spring concentrically disposed about the first and second cooperatively threaded members and between the platform member and the base member.

5. A wafer carrier adapter as in claim 2 wherein the means for attaching the platform member to the base member support structure includes at least three sets of first and second cooperatively threaded members arranged in a triangular configuration for adjusting the angular position of the platform member relative to the base member.

6. A wafer carrier adapter as in claim 1 in combination with the pod door opener.

7. A wafer carrier adapter as in claim 6 in combination with the 200 millimeter wafer carrier.

8. A silicon wafer processing assembly comprising a pod door opener to a front end of a semiconductor processing environment, the pod door opener having a platform positioned below a port, a kinematic coupling carried by the platform and including a plurality of pins extending upwardly in a predetermined pattern adapted to align and support a 300 millimeter wafer carrier relative to the port in the pod door opener, a 200 millimeter wafer carrier having a bottom surface provided with a plurality of recesses extending through the bottom surface in a predetermined configuration and a front opening for accessing silicon wafers in the 200 millimeter wafer carrier, a wafer carrier adapter carried by the platform and having top and bottom surfaces, the wafer carrier adapter being provided with a plurality of recesses extending through the bottom surface adapted to receive the plurality of pins, the plurality of recesses of the wafer carrier adapter corresponding in number to the plurality of pins and being arranged in a pattern corresponding to the predetermined pattern of pins for precisely aligning the wafer carrier adapter to the plurality of pins, the top surface having a plurality of protuberances for disposition in the plurality of recesses of the 200 millimeter wafer carrier, the plurality of protuberances arranged in a configuration relative to the plurality of recesses of the 200 millimeter wafer carrier for precisely aligning the 200 millimeter wafer carrier relative to the plurality of pins so that the front opening of the 200 millimeter wafer carrier faces the port in the pod door opener.

9. An assembly as in claim 8 wherein the wafer carrier adapter includes a base member and a platform member and an adjustment mechanism for selectively aligning the angular position of the platform member relative to the base member.

10. An assembly as in claim 8 wherein the adjustment mechanism includes at least one coil spring seated between the platform member and the base member.

11. A method for processing silicon wafers in a 200 millimeter wafer carrier having a bottom surface and provided with a plurality of recesses extending through the bottom surface in a predetermined configuration and utilizing a pod door opener to a front end of a semiconductor processing environment having a platform with a kinematic coupling which includes a plurality of pins extending upwardly in a predetermined pattern from the platform for aligning and supporting 300 millimeter wafer carriers relative to a port in the pod door opener, comprising the steps of registering a plurality of recesses opening through a bottom surface of a wafer carrier adapter with the plurality of pins to precisely align the wafer carrier adapter relative to the plurality of pins and positioning the 200 millimeter wafer carrier on a plurality of alignment protuberances provided atop the wafer carrier to precisely align the 200 millimeter wafer carrier relative to the plurality of pins and the port in the pod door opener.

12. The method of claim 11 wherein the wafer carrier adapter has a platform member and a base member, further comprising the step of adjusting the angular position of the platform member relative to the base member so as to properly align the 200 millimeter wafer carrier relative to the pod door opener.

13. The method of claim 11 further comprising the step of removing the 200 millimeter wafer carrier and the wafer carrier adapter from the pod door opener and positioning a 300 millimeter wafer carrier on the plurality of pins.

* * * * *